US008209828B2

(12) United States Patent
Feltz et al.

(10) Patent No.: US 8,209,828 B2
(45) Date of Patent: Jul. 3, 2012

(54) METHOD FOR MAKING A PIEZOCERAMIC DEVICE

(75) Inventors: Adalbert Feltz, Deutschlandsberg (DE); Sigrid Gansberger, Graz (AT); Heinz Florian, Bad Gams (AT); Harald Kastl, Bad Gams (AT)

(73) Assignee: Epcos AG, München (DE)

( * ) Notice: Subject to any disclaimer, the term of this patent is extended or adjusted under 35 U.S.C. 154(b) by 0 days.

(21) Appl. No.: 12/785,081

(22) Filed: May 21, 2010

(65) Prior Publication Data

US 2010/0294419 A1    Nov. 25, 2010

Related U.S. Application Data

(60) Division of application No. 11/406,587, filed on Apr. 19, 2006, now Pat. No. 7,855,488, which is a continuation of application No. 09/736,266, filed on Dec. 15, 2000, now abandoned.

(30) Foreign Application Priority Data

Dec. 16, 1999  (DE) ................................ 199 60 849

(51) Int. Cl.
*H01L 41/22* (2006.01)
*H04R 17/00* (2006.01)
(52) U.S. Cl. ........... 29/25.35; 29/25.42; 29/594; 29/825
(58) Field of Classification Search ................ 29/25.35, 29/25.42, 594, 595, 825
See application file for complete search history.

(56) References Cited

U.S. PATENT DOCUMENTS

| 3,809,973 | A | * | 5/1974 | Hurley ........................ 361/305 |
| 4,063,341 | A | * | 12/1977 | Bouchard et al. ............ 29/25.42 |
| 4,078,284 | A | * | 3/1978 | Capek et al. .................. 29/25.35 |
| 4,128,489 | A | | 12/1978 | Seo |
| 4,189,760 | A | * | 2/1980 | Marshall ....................... 361/322 |
| 4,347,167 | A | | 8/1982 | Payne et al. |
| 4,353,958 | A | | 10/1982 | Kita et al. |
| 4,755,493 | A | | 7/1988 | Takeuchi et al. |
| 4,917,810 | A | | 4/1990 | Tsunooka et al. |
| 4,988,909 | A | | 1/1991 | Hagimura et al. |
| 5,004,715 | A | * | 4/1991 | Hakotani et al. .............. 501/136 |
| 5,014,158 | A | * | 5/1991 | Nishimura et al. ........ 361/321.4 |
| 5,036,425 | A | | 7/1991 | Omori |
| 5,112,433 | A | | 5/1992 | Dawson et al. |
| 5,210,455 | A | | 5/1993 | Takeuchi et al. |
| 5,233,260 | A | * | 8/1993 | Harada et al. ................. 310/328 |
| 5,335,139 | A | * | 8/1994 | Nomura et al. ............ 361/321.4 |

(Continued)

FOREIGN PATENT DOCUMENTS
DE        40 05 505        8/1990
(Continued)

OTHER PUBLICATIONS

Coesa, US Standard Atmosphere, 1976, US Government Printing Office, Washington, DC, 1976.*

(Continued)

*Primary Examiner* — A. Dexter Tugbang
*Assistant Examiner* — Jeffrey T Carley
(74) *Attorney, Agent, or Firm* — Cozen O'Connor

(57) ABSTRACT

The invention concerns a method for making a piezoelectrical device, whose electrode layers contain copper. The usage of copper in the electrode layers is enabled by a debindering process, which is carried out by steam.

10 Claims, 5 Drawing Sheets

U.S. PATENT DOCUMENTS

| | | | |
|---|---|---|---|
| 5,340,510 | A | 8/1994 | Bowen |
| 5,376,857 | A | 12/1994 | Takeuchi et al. |
| 5,390,949 | A | 2/1995 | Naganathan et al. |
| 5,433,917 | A | 7/1995 | Srivastava et al. |
| 5,578,539 | A | 11/1996 | Glaubitt et al. |
| 5,648,012 | A | 7/1997 | Higashibeppu et al. |
| 6,080,328 | A | 6/2000 | Horikawa |
| 6,182,340 | B1 * | 2/2001 | Bishop .................. 29/25.35 |
| 6,232,701 | B1 * | 5/2001 | Schuh et al. ............ 310/328 |
| 6,236,146 | B1 | 5/2001 | Cramer et al. |
| 6,255,037 | B1 | 7/2001 | Kanoh et al. |
| 6,266,230 | B1 | 7/2001 | Kato et al. |
| 6,320,738 | B1 | 11/2001 | Yamana et al. |
| 6,370,014 | B1 | 4/2002 | Yoneda |
| 6,613,705 | B1 | 9/2003 | Feltz et al. |
| 6,692,598 | B1 | 2/2004 | Yamana et al. |
| 6,842,329 | B2 | 1/2005 | Feltz et al. |
| 7,358,655 | B2 | 4/2008 | Ragossnig et al. |
| 2002/0098333 | A1 * | 7/2002 | Feltz et al. ............... 428/210 |
| 2004/0139599 | A1 * | 7/2004 | Sumiya et al. ............ 29/831 |
| 2006/0119228 | A1 | 6/2006 | Florian et al. |
| 2006/0226569 | A1 | 10/2006 | Henneck et al. |
| 2008/0203853 | A1 | 8/2008 | Schuh et al. |
| 2008/0245991 | A1 | 10/2008 | Bamier et al. |
| 2008/0282536 | A1 | 11/2008 | Bamiere et al. |

FOREIGN PATENT DOCUMENTS

| | | |
|---|---|---|
| DE | 19749858 C1 | 4/1999 |
| DE | 199 16 380 A1 | 10/1999 |
| DE | 19841487 A1 | 3/2000 |
| DE | 199 46 834 | 5/2001 |
| DE | 10062672 A1 | 8/2001 |
| JP | 03 060 463 A | 3/1991 |
| JP | 04-074777 | 3/1992 |
| JP | 04171990 | 6/1992 |
| JP | 04324687 | 11/1992 |
| JP | 05 190 376 A | 7/1993 |
| JP | 07 277 822 A | 10/1995 |
| JP | 08 167 536 A | 6/1996 |
| JP | 8-301654 | 11/1996 |
| JP | 09 157 006 A | 6/1997 |
| JP | 10-17364 | 1/1998 |
| JP | 11-49572 | 2/1999 |
| JP | 11 292 625 A | 10/1999 |
| JP | 11-307307 | 11/1999 |
| JP | 11-330705 | 11/1999 |
| JP | 11-345745 | 12/1999 |
| WO | WO 97/40537 | 10/1997 |
| WO | WO 01/24287 A2 | 4/2001 |

OTHER PUBLICATIONS

T. Takenaka et al., "Ferroelectric and Piezoelectric Properties of Lead-Free (Bi1/2Na1/2)TiO3-KNbO3-1/2(Bi2O3xSc2O3) Ceramics", Proceedings of the Eleventh IEEE Int'l. Symposium in Applications of Ferroelectrics, Montreux 1998, IEEE Cat. No. 98CH36245, Aug. 24-27, 1998, pp. 559-562.

Gene H. Haertling, "Hot-Pressed Lead Zirconate-Lead Titanate Ceramics containing Bismuth", pp. 875-879, American Ceramic Bulletin, vol. 43, No. 12, pp. 875-879, (1964).

Kunihiro Nagata, "Properties of Piezoelectric Ceramics Sintered in Reducing Atmosphere", Japanese Journal of Applied Physics, Part 1, vol. 30, No. 9B, Sep. 1991, pp. 2224-2227.

Junichi Kato et al., "Dielectric Material in Lead-Based Perovskite and . . . ", pp. 54-69, Ceramic Transactions, vol. 8, 1990.

Heng C. Cao et al., "Structure and Properties at the Ferroelectric/ . . . ", Journal of the American Ceramic Society, pp. 3019-3023, vol. 76, No. 12, (1993).

Marianne Hammer et al., "Detailed X-ray Diffraction Analyses and . . . ", Journal of Electroceramics 2:2, pp. 74-84 (1998).

Yuhuan Xu, "Ferroelectric Materials and Their Applications", pp. 101-163 (1991), Elsevier Science Publishers.

G.H. Haertling et al., "Hot-Pressed (Pb, La)(Zr, Ti)03 Ferroelectric . . . ", pp. 1-11, Journal of The American Ceramic Society, vol. 54, No. 1, Jan. 1971.

B. Jaffe et al., "Piezoelectric Ceramics", pp. 1-317, Academic Press London, Feb. 1981.

Keigo Hirakata et al., "Multilayer Capacitors with Copper Inner Electrodes", Ferroelectrics, 1992, vol. 133, pp. 139-144 (1992).

Kunihiro Nagata, "Properties of Piezoelectric Ceramics Sintered in Reducing Atmosphere", Dept. of EE, National Defense Academy, vol. 30, #9B, Sep. 1991, pp. 2224-2227.

Fumio Uchikoba et al., "Processing and Characterization of Copper Internal Electrode Multilayer Capacitors", The American Ceramic Society, Ceramic Transactions, vol. 32, 1993, pp. 101-110.

Translation of Y. Yokotani, "Ceramic Layer Capacitor having an Internal Copper Electrode", Kinou-Zairyo (functional materials), vol. 11, No. 4, Apr. 1991, pp. 38-346.

English translation of the Examination Report issued Aug. 1, 2006 by the Japanese Patent Office in Japanese Patent Application No. 2001-545341.

Examination Report dated Aug. 1, 2006 for Japanese Patent No. 2001-545341 (204789C).

Jaffe, B. et al., "Piezoelectric Ceramics", p. 1-317, Academic Press London and New York (1971).

Schaumburg H., "Keramik"; B. G. Teubner 1994, ISBN 3-519-06127-9, p. 303, pp. 395-398, pp. 464-465.

Lucuta et al. "Structural Dependence on Sintering Temperature of Lead Zirconate-Titanate Solid Solutions" Journal of American Ceramics Soc., 68 (10), 1985, pp. 533-537.

Takasaki et al. "Hydride dissociation and hydrogen evolution behavior of electrochemically charged pure titanium" Journals of Alloys and Compounds 224, 1995, 269-273.

Hammer et al. "Sintering Model for Mixed-Oxide-Derived Lead Zirconate Titanate Ceramics" Journal of American Ceramics Soc., 81 (12), 1998, pp. 3277-3284.

* cited by examiner

METHOD FOR MAKING A PIEZOCERAMIC DEVICE

CROSS REFERENCE TO RELATED APPLICATIONS

This application is a divisional of U.S. patent application Ser. No. 11/406,587 filed Apr. 19, 2006, now allowed, which is a Continuation of U.S. patent application Ser. No. 09/736,266 filed Dec. 15, 2000, Abandoned, which claims priority from German Application No. 199 60 849 filed Dec. 16, 1999.

FIELD OF THE INVENTION

The present invention relates to a method for manufacturing a piezoceramic device wherein the device includes a stack of at least two ceramic layers and an electrode layer arranged between two ceramic layers.

Such devices may comprise a plurality of layers and uses. For example, they may be used in: actuators for effecting a low-inertia mechanical vibration of comparably high force via application of a select control voltage; bending elements to effect a high mechanical vibration of less force via application of select control voltage; or production of high electrical voltages. Piezoceramic devices may serve to detect mechanical acoustic vibrations and/or serve in their production via implementation in relevant devices.

In the manufacture of piezoceramic devices, technical solutions have up until now been predominantly based on ceramic masses of the Perovskite structure type with the general formula $ABO_3$. Herein, the piezoelectrical characteristics are brought to bear in a ferroelectrical condition. Lead zirconate titanate ceramics $Pb(Zr_{1-x}Ti_x)O_3=PZT$, modified with select additives, have been shown to demonstrate particular advantages. The combination of ceramics and additives is tailored to the so-called morphotropic phase interface of two co-existing ferroelectrical phases: a tetragonal and a rhombodic phase. Between the ceramic layers, produced according to known methods of ceramic foil technology, precious metal internal electrodes are applied by screen printing. The electrodes may comprise Ag/Pd in the molar ratio 70/30. At up to several hundred electrode layers, the piezoceramic devices are burdened with substantial costs. The precious metal electrodes permit the elimination of thermal dispergers and binders as well as other organic additives used in the process of ceramic foil production. Likewise organic components of screen printing-metal paste of the multilayer stacks are eliminated via air depolyrnerisation and oxydation such that a later sinter condensation at approximately 1100° C. to 1150° C. is made possible without damaging effects. Such effects may for example be effected by residual carbon which negatively influences the characteristics of the ceramics due to reduction reactions.

DESCRIPTION OF THE RELATED ART

Examples of $La_2O_3$ or $Nd_2O_3$ doped $Pb(Zr,Ti)O_3$ ceramics are documented in the literature, including by G. H. Haertling in the *American Ceramic Society Bulletin* (43(12), 875-879 (1964) and *Journal of the American Ceramic Society* 54, 1-11 (1971) as well as in *Piezoelectric Ceramics*, Academic Press, London and New York (1971) of B. Jaffe, W. R. Cook and H. Jaffe. Additional discussion may be found in Y. Xu in *Ferroelectric Materials and their Applications*, pages 101-163, Elsevier Science Publishers, Amsterdam (1991).

$La_2O_3$—in particular $Nd_2O_3$—additives induce the production of cation vacancies in the Pb positions of the crystal structure and at the same time increase the tendency to act as donors, particularly at insufficient oxygen partial pressure, which can lead to a depression of the insulating resistance and a rise in the dielectrcial losses, i.e., the sensitivity of the ceramic towards reduction is increased. At the same time, the additives stabilize the tetragonal phase and the kinetics of the orientation of the domains in the field direction at the polarity, i.e., the electro-mechanical behavior of the "soft piezoceramic" is influenced positively by such additives. For an advancement of the sinter condensation and prevention of evaporation losses of PbO in the ceramic, a low PbO surplus at the originally weighed-in composition is generally considered. The relationship between doping level by $La_2O_3$, in a $Pb(Zr_{0.47}Ti_{0.53}])O_3$—ceramic (supplied with 3 molar-% PbO surplus) is discussed in the *Journal of Electroceramics* 2(2), 75-84 (1998) by M. Hammer and M. Hoffmann. In the journal, the sinter behavior and structure formation associated therewith and electro magnetic characteristics (such as coupling factor) and dielectricity constant (such as curie temperature, maximum temperature for ferroelectrical) as well as associated piezoelectrical behavior are all examined.

Ceramic masses with bismuth oxide in place of lead oxide (for example $(Bi_{0.5}Na_{0.5})TiO_3$—$KNbO_3$—$BiScO_3$) were also taken into consideration by T. Takenaka and H. Nagata in *The Proceedings of the 11$^{th}$ International Symposium of Applied Ferroelectrics*, Montreux 1998, IEEE 98CH36245, 559-562 (1998). Herein, $Pb(Ti_xZr_{1-x})O_3$ was combined with $BiScO_3$ and/or $BiInO_3$. All of these ceramics are based on Perovskite mixed crystal phases which, in combination with Ag/Pd internal electrodes, produce a relatively positive behavior for the purpose of a piezostack when the debindering (the removal of the binder or binders) and the sinter condensation is performed.

Piezoelectrical ceramic masses of the general composition $(Pb_{1-x-\alpha-y}SR_xNR_\alpha M_y)_a$ $[(Nb_bY_cCr_dCo_eSb_\beta)_fTi_gZr_{1-f-g}]O_3$ are set out in U.S. Pat. No. 5,648,012 and are distinguished by high electro-mechanical coupling factors, whereby M is at least a rare earth metal of La, Gd, Nd, Sm and Pr and the parameter areas $0.005 \leq x \leq 0.08$, $0.002 \leq y \leq 0.05$, $0.95 \leq a \leq 1.105$, $0.47 \leq b \leq 0.70$, $0.02 \leq c \leq 0.31$, $0.11 \leq d \leq 0.42$, $0.01 \leq e \leq 0.12$, $0.02 \leq f \leq 0.15$, $0.46 \leq g \leq 0.52$, $0 \leq \alpha \leq 0.005$, $0 \leq \beta \leq 0.13$ such that $b+c+d+e+\beta=1.00$ are effected.

The publication WO 97/40537 discloses the production of green foils for piezoceramic multilayer devices. The green foils are based on a piezoceramic powder of the type PZT, to which a stochiometric surplus of a heterovalent rare earth metal (up to a content from 1 to 5 molar-%) and a stochiometric surplus of an additional 1-5 molar-% lead oxide is added. In addition, it is disclosed in above publication that $Ag^+$-ions from the area of Ag/Pd internal electrodes diffuse into the ceramic layers of the multilayer devices such that the heterovalent doping produced cation vacancies are occupied and accordingly result in a filled up Perovskite structure. This structure may be: $Pb_{0.99}Ag_{0.01}La_{0.01}[Zr_{0.30}Ti_{0.36}(Ni_{1/3}Nb_{2/3})_{0.34}]O_3$ or $Pb_{0.96}Ag_{0.02}Nd_{0.02}(Zr_{0.54}, Ti_{0.46})O_3$. Herein, a piezoceramic is produced with a comparatively high Curie temperature for applications of up to 150° C. Furthermore, solidity between the Ag/Pd internal electrode (70/30) and the ceramic, as well as growth during the sintering, are positively influenced by building silver into the ceramic.

U.S. Pat. No. 5,233,260 discusses piezoactuators which are not produced in the traditional monolithic manner. Rather, the ceramic layers are separately sintered and only then stacked and agglutinated. This production method is costly. Furthermore, these piezoactuators have the disadvantage that the glue used has a negative effect on the electrical characteristics.

Cao et al. in the journal *American Ceramic Society* 76(12) 3019 (1993) discuss a donor doped ceramic and in particular, a Cu foil laid between pre-made ceramic segments $Pb_{0.988}(Nb_{0.024}Zr_{0.528}Ti_{0.473})O_3$. The sandwich arrangement is subject to sintering at 1050° C. under vacuum. The composite between the ceramic and Cu internal electrode and the absence of the migrational effects (such as those observed at Ag electrodes on air) are emphasized in the article. However, the disclosed method does not lend itself to the requirements of an efficient production, including foil multilayer technology, and is therefore not appropriate for a mass production.

Kato et al. teach, in *Ceramic Transactions* Vol. 8, pages 54-68 (1990), the production of multilayer condensators with Z5U based on ceramics having the general formula $(Pb_a—Ca_b)\ Mg_{1/3}Nb_{2/3})_xTi_y(Ni_{1/2}W_{1/2})_zO_{2+a+b}$ (a+b>1, x+y+z=1) with Cu internal electrodes, wherein a copper oxide screen-printing paste is used. Air-debindering is thereby made possible. The carbon formation, which would inevitably come into effect under nitrogen at a well tolerated metallic copper (with oxygen) partial pressure, and afterwards at the sinter condensation, leads to a reductive degradation of the ceramic with Cu/Pb alloying production the eutectic melting point lying at TS=954° C. is thereby avoided. After the debindering, the sinter condensation is then carried out at 1000° C. by additional dosage of hydrogen at an oxygen partial pressure of $10^{-3}$ Pa and the copper oxide is accordingly reduced to copper. The process is interference-prone, because of the shrinkage during the reduction from copper oxide to copper and resulting delamination and has up to now not been technologically converted into products.

DE 19749858 C1 sets out the production of COG with internal electrodes formed of a ceramic mass with the general composition $B_a{}^{II}{}_{1-y}Pb_y)_{6-x}Nd_{8+2x/3}Ti_{18}O_{54}+zm-\%\ TiO_2+$ pm-% Glas at lower PbO content (0.6<x<2.1; 0<y<0.6, 0<z<5.5 and 3<p<10). A sufficient elimination of the organic components by feeding steam into the nitrogen flux with $<10^{-2}$ Pa oxygen partial pressure at temperatures up to 680° C. and the sinter condensation at 1000° C. is reached by apt glass frit additives.

BRIEF SUMMARY OF THE INVENTION

An advantage of the present invention provides an alternative to the expensive Ag/Pd internal electrodes used in the related art. It is a further advantage to provide a substitution which does not oxidize and remains relatively stable during production. It is still a further advantage to provide a method which can be implemented to enable mass production at reasonable engineering effort and expense and with maximally replicable component characteristics. These and other advantages are realized by the present invention wherein, copper is substituted for Ag/Pd for use in a PZT-type piezo-ceramic multilayer element. Copper has been shown not to reduce or oxidize and otherwise remain stable under conditions, including temperatures around 1000° C. under low oxygen partial pressure of $<10^{-2}\ P_a$.

The present invention encompasses methods of making all piezoceramic devices available in a monolithic multilayer formation, and in particular Perovskit ceramic. Modifications by mixed crystal formation via building in cations on the-A positions and/or substitution of the B-cations with suitable replacement cations or combinations thereof can be effected. Ceramic foil production techniques may be employed along with sintering techniques in the formation of the present invention. For example, screen printing can be used for making the copper or copper mixted internal electrodes.

Such piezoceramic multilayer devices can be realized for example as actuators by an apt process guide, by which the debindering of the green foil stacks is carried out by steam thereby avoiding the oxidation of the copper containing internal electrodes. The following sinter condensation to a monolithic multilayer device can be carried out in an advantageous ways at about 1000° C., i.e., below the melting temperature of the copper.

A further advantage of the present invention may be found in that for a PZT ceramic mass, copper-containing internal electrodes are applied in place of the normally used Ag/Pd internal electrodes (70/30) on the basis of the multilayer foil technique, whereby the practically complete debindering can be successfully done before effecting the sinter condensation, and under inert conditions, in such a way that a lot of steam is supplied to the inert atmosphere during the debindering thereby permitting only a set oxygen partial pressure, and hence leaving the copper containing internal electrodes relatively intact. Accordingly, by the present method, piezoactuators are created which have the same if not superior quality to those currently available. Likewise, the presence of the copper electrodes do not have any deliterious effects on the piezoactuators.

A preferred step in the present method includes a step wherein cations are built in on A-positions of the ceramic and at which cations on B-positions are replaced by apt other cations or combinations of cations. For example, on A-positions of the ceramic bivalent metal cations $M^{II}$ may be built. These can be selected for example from a group of elements, which contain barium, strontium, calcium, copper and bismuth. Bivalent metal cations $M^{II}$ from a group of elements including scandium, yttrium, lantanum or from group of lanthanides can be considered for the A-positions of the ceramic.

Further, monovalent cations can be built in on the A-positions of the ceramic, which are selected advantageously and from a group of elements which contains silver, copper, sodium and potassium. In addition it is also possible, to build in combinations of bivalent metal cations $M^{II}$ and monovalent cations on A-positions.

Furthermore, a preferred embodiment includes the partial substitution of the quadrivalent cations Zr and Ti on the B-positions of the ferroelectrical Perovskite ceramic. In fact, combinations of mono- and quintvalent metal cations $M^1{}_{1/4}M^V{}_{3/4}$ with $M^1$=Na, K and $M^V$=Nb, Ta or two- and quintvalent metal cations $M^{II}{}_{1/3}M^V{}_{2/3}$ with $M^{II}$=Mg, Zn, Ni, Co and $M^V$=Nb, Ta or three- and quintvalent metal cations $M^{III}{}_{1/2}M^V{}_{2/3}$ with $M^{III}$=Fe, In, Sc, heavier lanthanide-elements and $M^V$=Nb, Ta or combinations $M^{III}{}_{2/3}M^{VI}{}_{1/3}$ with $M^{III}$=Fe, In, Sc, heavier lanthanide-elements and $M^{VI}$=W resp. $M^{II}{}_{1/2}M^{Vi}{}_{1/2}$ with $M^{II}$=Mg, Co, Ni and $M^{VI}$=W may be employed.

Still a further advantage includes the composition of the ceramic with the general formula $^{Pb}1\text{-x-y}^{SE}{}_x{}^{Cu}y^{V_{III}}x/2(^{Zr}0.54\text{-}z^{Ti}0.46\text{+}z)^O3$ wherein 0.01<x<0.05, −0.15<z<+0.15 and 0<y<0.006, whereby SE is a rare earth metal, V is a vacancy and a PbO-surplus is set from 1 up to maximally 5 molar-%.

Yet further, atop the ceramic an additive of CuO may be included.

The invention includes the realization that the by donors, e.g., a rare earth metal doped piezo ceramic on the basis of PZT, because of the formation of cation vacancies on the A-positions of the Perovskit structure, e.g., according to the composition $Pb^{II}{}_{0.97}Nd^{III}{}_{0.02}V''Pb,0.01(^{Zr}0.54^{Ti}0.46)^O3$ (V'' meaning an empty space), develops a certain affinity to absorb copper from the internal electrodes without destroying them by elimination of equivalent PbO-shares, whereby the latter combination acts as a sinter aid and up to some percentage of PbO is separately added to the ceramic anyway.

The sinter condensation is supported by the known mobility of the copper ions and leads, by the copper migration, to a solid adhesion between the electrode layer and ceramic such that determinations can be effectively avoided.

It is still further an advantage to already add some CuO within the limits $0<y<0.15$ to the original mixture of the used recipe for piezostacks, e.g., on the basis of PZT with Cu-internal electrodes corresponding to the general formula $Pb^{II}_{1-x-y}SE^{III}_{x}Cu_{y}V''_{x/2}(Zr_{0.54-z}Ti_{0.46+z})O_3$ with $0.005<x<0.05$ and $-0.15<z<+0.15$ (SE=Rare Earth Metal). The piezoelectrical characteristics, like the high value for the electromechanical coupling factor can be maintained at corresponding adjustment of the parameter z to the morphotropic phase interface.

BRIEF DESCRIPTION OF THE DRAWINGS

Some of the features, advantages, and benefits of the present invention having been stated, others will become apparent as the description proceeds when taken in conjunction with the accompanying drawings wherein.

DETAILED DESCRIPTION OF THE INVENTION

Figure 1:
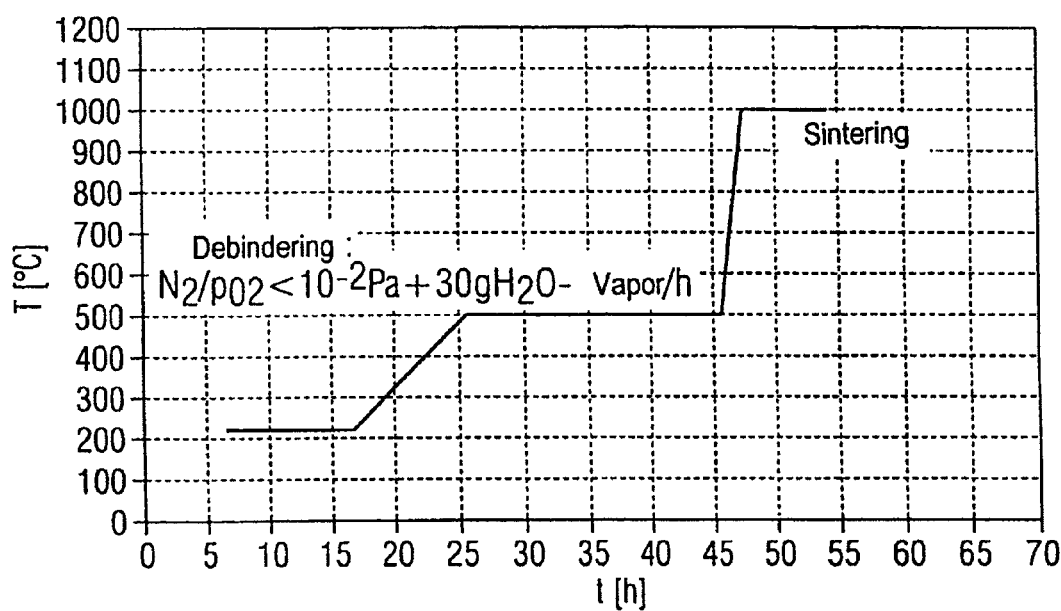
FIG. 1 depicts temperature control during debindering and sintering.

A piezoceramic Perovskite-mixed crystal phase is built according to the following steps: $TiO_2$, $ZrO_2$ (each may be from a mixed precipitation produced precursor $(Zr, Ti)O_2$) and $PbCo_3$ (e.g., $Pb_3O_4$ and dopants like $La_2O_3$ or from another oxyde of the rare earth metals) and if necessary an additive of CuO based raw material mixture is set in its composition on the morphotropic phase interface with a PbO-surplus of maximally 5% to support the sinter condensation; for even distribution, the component undergoes a grinding step in diluted suspension and is calcinated after the filtering; and drying occurs at 900 to 950° C. To obtain sinter condensation in 2 to 4 hours at about 1000° below the melting temperature of copper, a pulverization to a medium grain size <0.4 µm is necessary. The sinter activity of the powder is normally sufficient to guarantee a condensation of >96% of the theoretical density at both sufficient grain growth and adequate mechanical solidity in the ceramic structure.

The finely ground powder is suspended in a diluted slip with approx. 70 m-% solid substance content by use of a disperger, thus corresponding to approximately 24 vol.-%. For this, the optimal dispersing dispergator portion is separately determined in a series of tests, which can be recognized by obtaining a certain viscosity minimum. For the formation of the piezoceramic-green foils, approximately 6 m-% of a commercial binder is added to the dispersed suspended solids, which is thermohydrolytically degradable. Accordingly, a diluted polyurethane dispersion has been shown to have advantage effects. It is mixed in a disperse mill and accordingly provided for the process of "foil-pulling" (in particular for the production of a spraying granular apt slip).

Compact green discoids (produced from the granular) or small square multilayer printed boards ("MLP" produced by stacking and laminating 40 to 50 µm thick green foils without print and with Cu-electrode paste) can be debindered up to a residue carbon content of 300 ppm in a $H_2O$-steam containing inert atmosphere at a defined oxygen partial pressure, which fulfills the condition of the coexistency of PbO and in particular $Bi_2O_3$-containing piezoceramic and copper.

The hydrolytical separation of the binder takes place primarily at a low temperature of 200±50° C. and at a steam partial pressure larger than 200 mbar. The oxygen partial pressure is set to a value which is well-tolerated by the copper containing electrodes. This is done by gettering the oxygen from the flow of gas at surfaces of Cu or by adding $H_2$. During the debindering by oxidation, the flow of gas avoids damage to the ceramic. Although the electrode layers support the debindering, because preferred paths for a binder transportation is created by them, there is still a considerable debindering time necessary, particularly for the actuators with 160 electrodes (measurements 9.8*9.8*12.7 mm³).

The invention enables herewith the production of actuators with more than 100 internal electrodes, which has the advantage of a highly obtainable actuator-excursion. Examples for a debindering control are found in Table 1 by indicating the residue carbon content of the obtained devices. The dew point for steam of both debindering programs lies at 75° C., the partial pressure of the steam corresponds to 405 mbar.

TABLE 1

| Debindering of ceramic samples MLP and actuators | | | |
|---|---|---|---|
| Profile | Conditions (R: ramp, H: holding time) | Samples | C |
| EK1 | R: 30 K/h H: 220° C./10 h R: 30 K/h H: 500° C./20 h, at 100 1/h $N_2$, 30 g/h $H_2O$, with Cu-gettering | Ceramic samples MLP | 240 |
| EK2 | R: 30 K/h H: 220° C./40 h R: 30 K/h H: 500° C./20 h, at 100 1/h $N_2$, 30 g/h $H_2O$, with Cu-gettering | Actuator 160 electrodes | 300 ± 30 |

The soaking time at 220° C. is prolonged to 40 h for actuators with 160 layers (EK 2). Afterwards a condensation of the ceramic at 1000° C. without detrimental reductive degradation is effected with the residue carbon of 300±30 ppm in the indicated sinter profile.

FIG. 1 shows the temperature control during the debindering and sintering. The steam partial pressure supplied with the nitrogen flux corresponding to a dew point of 75° C. is indicated as well. At such debindered PZT-ceramic samples, the sinter condensation is effected at 1000° C. without creating a reductive degradation of the ceramic. The dielectrical and especially the piezoelectrical characteristics of the obtained samples with the measurements of approximately 10.10 mm² and 0.7 (in particular 2 mm consistency) are measured after contacting by sputtering of Au-electrodes and compared with the air-debindered (sintered at 1130° C.) samples of the same geometry.

For air-sinterings of ceramic samples MLP without internal electrodes with the composition $Pb^{II}_{0.97}Nd^{III}_{0.02}V^{m}_{0.01}(Zr_{0.54}Ti_{0.46})O_3$ and under inert conditions, whereby the latter correspond to the requirements of a common sintering with copper, the results of the electrical measurings are compiled in Table 2. Measurements of the polarized samples are set out in Tables 3 to 5. In addition, the codes of a CuO-doped ceramic mass during sintering under inert conditions are also set out.

Table 2 includes characteristics of square ceramic samples MLP (edge length 1, consistency h): Samples (a), (b) and (c) with the composition $Pb_{0.97}Nd_{0.02}(Zr_{0.54}Ti_{0.46})O_3$. Sample (d) with the composition $Pb_{0.96}Cu_{0.02}Nd_{0.02}(Zr_{0.54}Ti_{0.46})O_3$ (a) powder pre-ground to a medium grain size d50%=0.53 μm, air-sintering at 1120° C.; (b), (c) and (d) powder finely ground to a medium grain size d50%=0.33 air-sintered (b) at 1000° C. resp. (c) and (d) at 1000° C. under $N_2/H_2O$-steain are also set out.

$$f_s = \frac{1}{2\pi} \cdot \sqrt{\frac{1}{C_1 L_1}} \quad f_p = \frac{1}{2\pi} \cdot \sqrt{\frac{C_0 + C_1}{C_0 C_1 L_1}}$$

thereby permitting calculation for each vibration mode of the MLP sample of the effective coupling factor according to:

$$K_{eff}^2 = \frac{f_p^2 - f_s^2}{f_p^2}$$

$$= \frac{\frac{C_0 + C_1}{C_0 C_1 L_1} - \frac{C_0}{C_0 C_1 L_1}}{\frac{C_0 + C_1}{C_0 C_1 L_1}}$$

$$= \frac{C_1}{C_0 + C_1}$$

| Sample MLP | h/mm | l/mm | C/nF | ε | Tan δ | $R_{IS}/\Omega$ | ρ/Ωcm |
|---|---|---|---|---|---|---|---|
| (a) | 0.59 ± 0.02 | 10.8 ± 0.1 | 2.20 ± 0.05 | 1268 ± 30 | 2.1 ± 0.1% | $1*10^{11}$ | $2*10^{12}$ |
| (b) | 0.70 ± 0.01 | 10.6 ± 0.1 | 1.60 ± 0.03 | 1137 ± 58 | 2.8 ± 0.2% | $2*10^{11}$ | $3*10^{12}$ |
| (c) | 0.71 ± 0.02 | 11.0 ± 0.8 | 1.62 ± 0.07 | 1132 ± 81 | 2.8 ± 0.6% | $5*10^{9}$ | $9*10^{10}$ |
| (d) | 0.70 ± 0.01 | 11.3 ± 0.1 | 1.92 ± 0.01 | 1196 ± 8 | 1.9 ± 0.3% | $7*10^{10}$ | $1*12^{12}$ |

TABLE 3

Characteristics of square ceramic samples MLP (edge length 1, consistency h) with the composition according to Table 2 after the polarity with 1200 V (a) resp. 1400 V ((b) and (c) and (d)).

| Sample MLP | h/mm | l/mm | C/nF | ε | Tan δ | $R_{IS}/\Omega$ | ρ/Ωcm |
|---|---|---|---|---|---|---|---|
| (a) | 0.59 ± 0.02 | 10.8 ± 0.1 | 2.54 ± 0.13 | 1460 ± 134 | 1.9 ± 0.1% | $1*10^{11}$ | $2*10^{12}$ |
| (b) | 0.70 ± 0.01 | 10.6 ± 0.1 | 1.70 ± 0.03 | 1207 ± 58 | 2.1 ± 0.1% | $1*10^{11}$ | $2*10^{12}$ |
| (c) | 0.71 ± 0.02 | 11.0 ± 0.8 | 1.75 ± 0.05 | 1238 ± 69 | 2.3 ± 0.1% | $2*10^{11}$ | $5\,10^{12}$ |
| (d) | 0.70 ± 0.01 | 11.3 ± 0.1 | 2.11 ± 0.01 | 1317 ± 69 | 10.2 ± 0.8% | $8*10^{10}$ | $1*10^{12}$ |

The characteristic values prove that PZT ceramic samples, which were not air-bindered and were sintered, show comparable dielectrical characteristics.

The results of Table 4 are based on electro-mechanical vibration measurements with the aid of an impedance measuring bridge, whose evaluation from the parallel and serial resonance frequency fp, $f_s$ of the resonant circuit is effected according to the following:

As such, the proportion of the mechanical energy for the entire energy is indicated by $C_1/(C_0+C_1)$.

Table 4 depicts effective piezoelectrical coupling factors of the MLP samples from Table 3 for two fundamental vibrations, determined from the measurement of each 3 MLP samples, sintered under the indicated conditions (a), (b), (c) and (d) in Table 2.

|     | Planar vibration | | | Consistency mode of vibration | | |
| --- | --- | --- | --- | --- | --- | --- |
| MLP | $f_{S/kHz}$ | $f_{p/KHz}$ | $k_{eff}$ | $f_{S/kHz}$ | $f_{p/kHz}$ | $k_{eff}$ |
| (a) | 158 ± 1 | 191 ± 2 | 0.56 ± 0.01 | 3293 ± 15 | 3848 ± 79 | 0.52 ± 0.03 |
| (b) | 166 ± 2 | 198 ± 4 | 0.54 ± 0.01 | 2900 ± 78 | 3197 ± 25 | 0.42 ± 0.05 |
| (c) | 163 ± 1 | 189 ± 5 | 0.51 ± 0.04 | 2830 ± 111 | 3100 ± 108 | 0.40 ± 0.02 |
| (d) | 154 ± 2 | 186 ± 2 | 0.56 ± 0.03 | 2668 ± 36 | 3048 ± 47 | 0.48 ± 0.03 |

The measurement of the Curie temperature at samples (c) show a value of 339±2° C.

Electromechanical coupling factors which are in the area of the air-sintered samples are accrued from the produced samples sintered commonly under these conditions with copper. The results of an excursion measurement on ceramic samples MLP are listed in Table 5. The excursion Δh was determined parallely to the polarized direction 3, in which the measuring voltage was set. The excursion measurement was carried out by inductive path measuring by setting up an electrical field E with a field strength of 2000 V/mm. Prior to this measurement, the samples were impinged by a field strength of 2000 V/mm in the polarized direction to rule out after-polarity effects and increased hysteresis because of the bedding after the polarity.

The relative density S of the ceramic samples MLP is calculated from the measured excursion Δh divided by the sample consistency h. From this, the piezoelectrical coefficient $d_{33}$ results for the equation:

$$S_3 = d_{33} * E_3$$

wherein $d_{33}$ is a geometrically independent value for the piezoelectrical large signal characteristics of the examined ceramic.

Table 5 sets out an excursion measurement of square ceramic samples ML: (edge length 1, consistency h) with the composition according Table 2 by setting a voltage of 2 kV/mm. Electrical measurement voltage U, excursion Δh, and the piezoelectrical constant $d_{33}$ are indicated.

| Sample MLP | h/mm | U/V | Δh/μm | $d_{33} \cdot 10^{-12}$ m/V |
| --- | --- | --- | --- | --- |
| (a) | 0.59 ± 0.02 | 1180 ± 4 | 0.88 ± 0.01 | 747 ± 10 |
| (b) | 0.70 ± 0.01 | 1400 ± 4 | 0.99 ± 0.01 | 712 ± 10 |
| (c) | 0.71 ± 0.02 | 1420 ± 4 | 1.03 ± 0.06 | 723 ± 40 |
| (d) | 0.70 ± 0.01 | 1400 ± 4 | 1.03 ± 0.01 | 739 ± 4 |

In case of printing on Cu-internal electrodes, a Cu-screen print paste is preferable which has a metal content as high as possible of approx. 75 m-% and is processed with a special high-polymer and is thereby a very viscous binder (which produces at already <2m-%, related to the solid substance content, a viscosity as thixotrope as possible, preferably >2000 mPa*s). First, multilayer samples "VS" with up to 20 internal electrodes are produced for sampling purposes. Thereafter, piezostacks with 100 to 300 Cu-internal electrodes are built up in a second step and are debindered and sintered under the above mentioned conditions of a defined oxygen partial pressure in the presence of steam.

The piezoceramic green foils are produced in a consistency, which produces, by considering the linear shrinkage during the sintering of typically 15%, a piezoceramic consistency from 20 to 200 The Cu-electrodes have a layer consistency from 1 to 3 μm after the sintering.

Figure 2A:
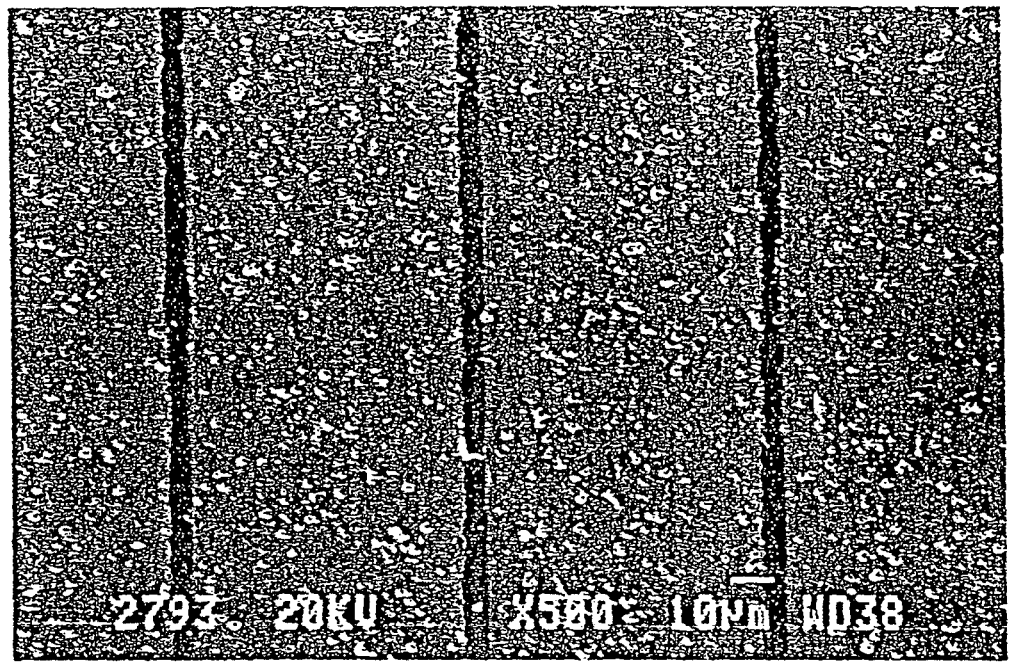
FIGS. 2a and 2b depict a partial cross section of a multilayer stack with alternating sequence of PZT ceramic foils and Cu-internal electrodes.
Figure 2B:
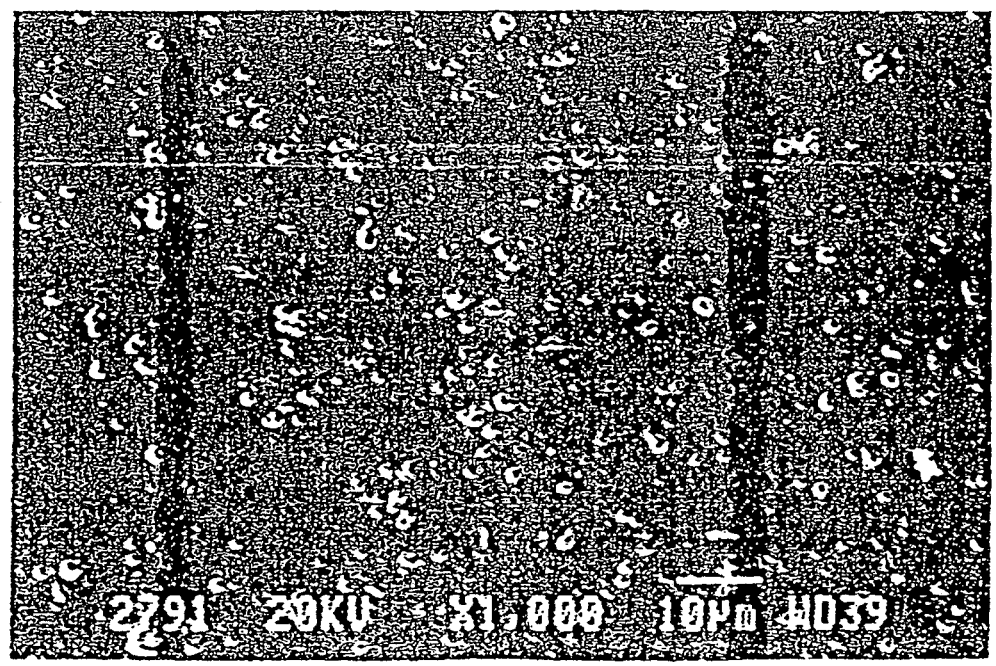

FIGS. 2a and 2b depict a schematic cross section of a multilayer stack with an alternating sequence of PZT ceramic foils and Cu-internal electrodes in 500 times (FIG. 2a) and in 1000 times (FIG. 2b) enlargement.

Figure 3A:
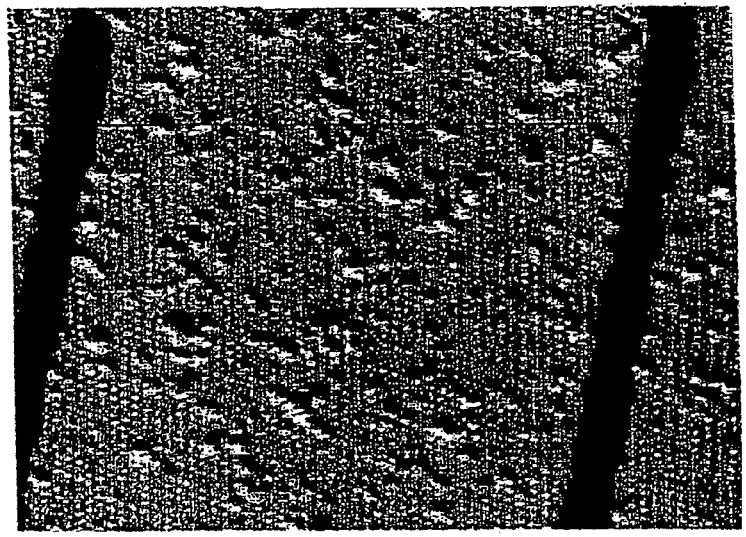
FIGS. 3a and 3b depict a measuring curve of copper content of piezoceramic layer and a section view of the piezoceramic layer.
Figure 3B:
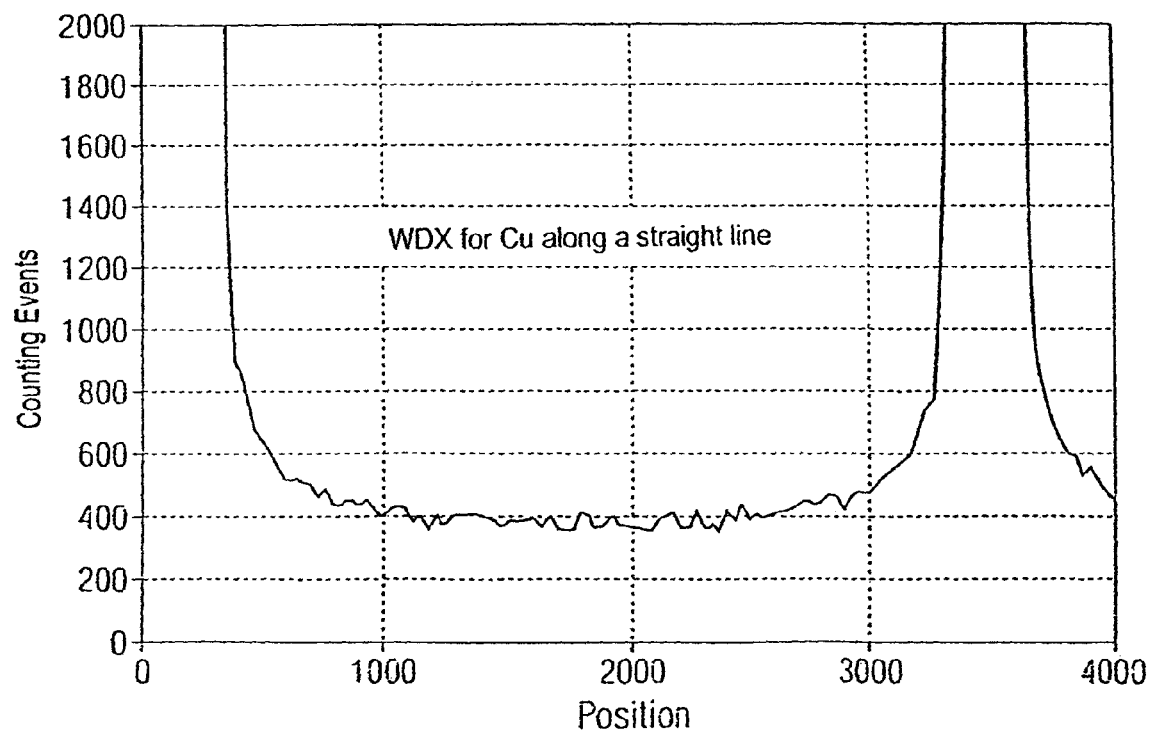

FIG. 3b shows a measuring curve for the Cu-content of the piezoceramic layer, shown in FIG. 3a, about the layer consistency after the sintering of a piezostack on the basis of the used original composition $Pb^{II}_{0.97-y}Nd_{0.02}Cu_yV''_{0.01}(Zr_{0.54-z}Ti_{0.46+z})O_3$. It can be seen that the copper content in the ceramic layer dissolves starting from the border. The calibration produces in the middle of the ceramic layer the minimal amount of y=0.001. At the borders there is a value which is 20 times higher. Some lead oxide is displaced from the combination as a result of the influence of diffused Cu-ions. The good connection of the Cu-internal electrodes to the ceramic is thereby set out.

The electrical characteristics of the multilayer ceramic components VS of the original composition $Pb_{0.97}Nd_{0.02}V_{0.01}(Zr_{0.54}Ti_{0.46})O_3$ after the sintering at 1000° C. with 16 Cu-internal electrodes—and for comparison with 20 Ag/Pd-internal electrodes (70/30) after the air-sintering at 1120° C.—are indicated in Table 6. Table 6 sets out electrical characteristics of PZT multilayer ceramic samples VS on the basis of the original composition $Pb^{II}_{0.97}Nd^{III}_{0.02}V''_{0.01}(Z_{0.54}Ti_{0.46})O_3$: (a) powder pre-ground, medium grain size d50%=0.53 μm, 20 internal electrodes Ag/Pd (70/30), air-sintering at 1120° C., (c) powder finely ground, medium particle size d50%=0.33 μm, 16 Cu-internal electrodes, sintering at 1000° C. under inert conditions by $N_2/H_2O$ steam.

| Sample VS | Comments | C/nF | ε before polarization | ε after polarization | tan δ after polarization | $\rho_{IS}/\Omega cm$ after polarization |
| --- | --- | --- | --- | --- | --- | --- |
| (a) | Ag/Pd(70/30): Debindering/air-sintering 1120° C., Cu-finished. | 125 ± 5 | 1104 ± 54 | 1561 ± 92 | 0.015 | 7.9 * 10^11 |
| (c1) | Cu-internal electrodes: Debindering/sintering under $N_2/H_2O$ steam, Cu-finished. | 110 ± 4 | 908 ± 35 | 953 ± 37 | 0.027 | 2.7 * 10^10 |

| Sample VS | Comments | C/nF | ε before polarization | ε after polarization | tan δ after polarization | $\rho_{IS}/\Omega cm$ after polarization |
|---|---|---|---|---|---|---|
| (c2) | Cu-internal electrodes: Debindering/sintering under $N_2$, $H_2O$ steam, Cu-finished. | 114 ± 4 | 946 | 1013 | 0.026 | $1.6 * 10^{10}$ |

Production of a piezo actuator from a ceramic of PZT type with Cu-internal electrodes.

For the production of piezo actuators with 160 Cu-internal electrodes, the green foils produced according to the method of the consistency from 40 to 50 μm are further processed according to the multilayer ceramic condensators method. The printing of the square cut PZT ceramic foils is done mechanically by screen printing technique (400 mesh) with the piezo actuators common electrode design by usage of a commercial Cu-electrode paste. The stacking is done such that on every two non-printed foils a printed one follows. 100 piezo actuators in a green condition are received from the block, after laminating, and pressing or sawing.

The debindering is carried out according to the FIG. 1 shown temperature time diagram in nitrogen stream by adding steam and hydrogen so that there is a target value from $5*10^{-2}$ to $2*10^{-1}$ Pa for the $O_2$ partial pressure produced in the area of 500° C. Essentially, lower oxygen partial pressures occur locally during the debindering. The ceramic is not subject to the reductive degradation in the temperature area of the debindering, because the equilibrated oxygen partial pressure is lowered as well, conditioned thermodynamically, and the reduction processes are kinetically sufficiently obstructed. The green parts of the multilayer piezo actuators still show a residue content of carbon of 300 ppm after the debindering and are afterwards ready to be sintered in the same set atmosphere without causing a reductive degradation which lead to cracking, delamination and eventually to drifting of the internal electrodes because of the production of a low melting Cu/Pb-alloy.

Steam and forming gas are added to the nitrogen flux ($N_2$+–5% $H_2$). The dissociation of the steam according to $$H_2O \Leftrightarrow H_2 + \tfrac{1}{2}O_2$$

is used for setting a certain oxygen partial pressure. Corresponding to the law of mass action $$K_D = \frac{p(O_2)^{1/2} \cdot p(H_2)}{p(H_2O)}$$

a certain oxygen partial pressure is thereby determined at a given temperature for a defined partial pressure ratio of steam and hydrogen. The calculation of the thermodynamic data produces the data depicted in FIG. 5, namely the curves for different $H_2/H_2O$ ratios of concentration.

Normally the gas composition is selected in such a way, that the requested oxygen partial pressure is produced at sinter temperature $T_{Sinter}$. This condition is for example depicted in FIG. 5. Starting from this value the $p(O_2)$ runs parallel to the other curves with decreasing temperature. However, the $p(O_2)$ value is low for $T<T_{Sinter}$, which is still tolerable if needed. The gas control curve Cu1 according to Table 7 corresponds to this process. The equilibrium of Pb/PbO falls short starting at approx. 900° C., conditioned by the narrow thermodynamic window through which metallic lead is produced if there is sufficient kinetic activity.

Figure 5:
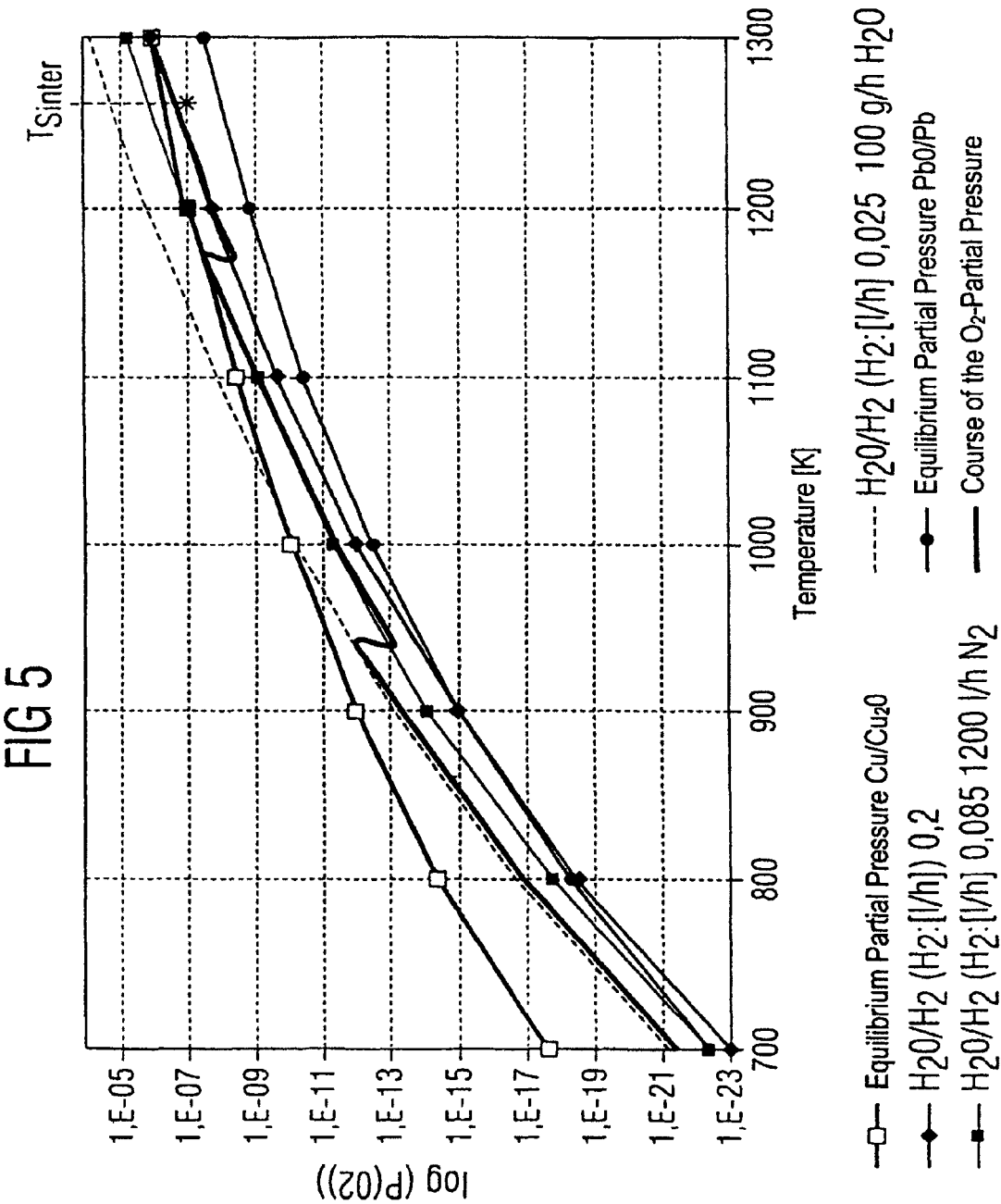
FIG. 5 depicts a calculation of thermodynamic data as curves for different $H_2/H_2O$ concentrations.

Alternatively, $p(O_2)$ was set with different forming gas dosage corresponding to the gas control $Cu_2$—the actual course of the oxygen partial pressure at up to 400° C. lay in the thermodynamic window. This way of process is good for the little reductive solid PZT mixture. The used adjustments Cu1 and Cu2 for the gas control are indicated in Table 7. FIG. 5 shows the calculated course of the partial pressure for the different ratios of concentration of the gases.

TABLE 7

| | Gas control Cu1 and Cu2 | | | |
|---|---|---|---|---|
| | Cu1 | Dosage | Cu2 | Dosage |
| $N_2$ | Entire sintering | 90 1/h | Entire sintering | 1200 1/h |
| $H_2/H_2O$ | Entire sintering | 40 g/h | Entire sintering | 100 g/h |
| $N_2$ + 5%$H_2$ | Entire sintering | 256 ml/h | 25-650° C. | 25 ml/h |
| | | | 650-900° C. | 85 ml/h |
| | | | 900-1000° C. | 200 ml/h |
| | Dewing point 36° C. | | Dewing point 48° C. | |

The sinter profile is as follows: the holding time at maximal temperature lies between 2 and 12 hours. The heating up ramp and the cooling down ramp are effected at 5 K./min; and the actuators are slowly heated up at 1 K./min. The in steps adjusted set-up of the oxygen partial pressure (FIG. 5) runs in conformity with the temperature curve, which is obtained by an alteration of the forming gas flow meter. Thereby, the steam partial pressure (100 g/h) is constant.

The obtained ceramic is tightly sintered to >96% and shows mostly homogenous low porosity. The sinter grains grow according to the piezoelectrical characteristics with an advantageous medium grain size of 0.8-5 μm. Intact and crack-free actuators are obtained. The sequence of the internal electrodes and PZT ceramic layers is shown in a section in FIGS. 2a and 2b. The medium grain size in the ceramic structure is $d_{50}$=1.6±0.3 μm.

The piezo actuators are ground and polished for the finishing and contacted in the area of the exiting internal electrodes according to applications common to Cu-paste and burned-in at 935° C. according to a preset temperature time curve. The piezo actuators respond to the electrical measuring after the application of wires by known Bond technology.

Figure 4:
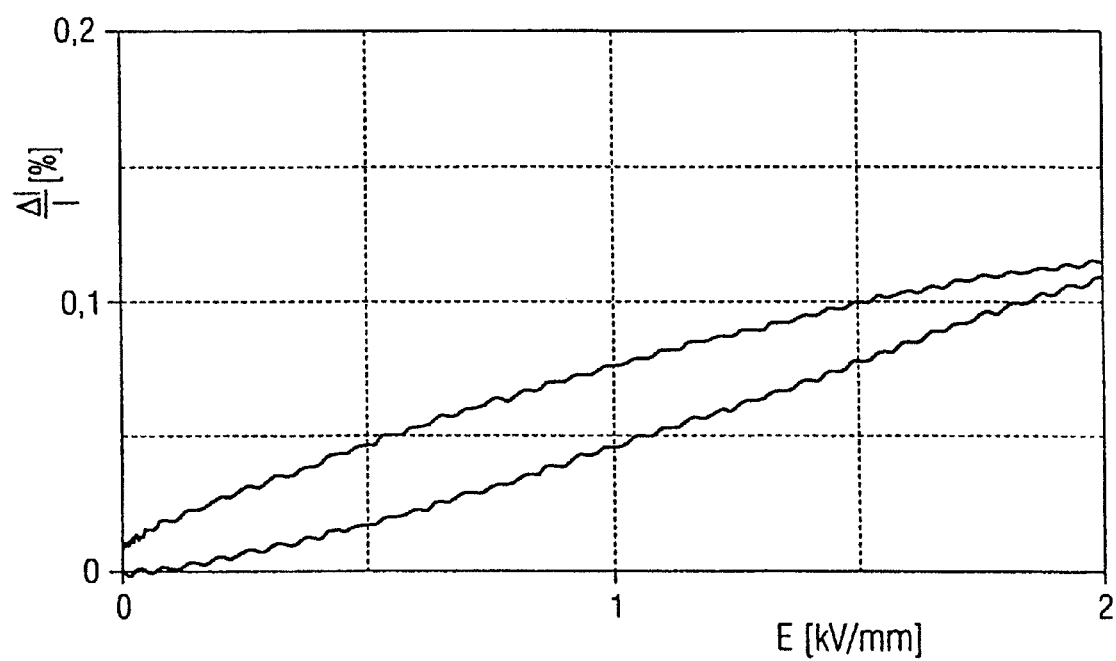
FIG. 4 depicts a diagram of an excursion curve for a polarized PZT-piezoactuator with Cu-internal electrodes.

The diagram of a vibration curve for a polarized PZT-piezoactuator with 160 Cu-internal electrodes is depicted in FIG. 4. A density of 0.123% is produced by a voltage setting of 140.6 Volt at a consistency of 70 μm of the PZT ceramic layers. The piezoelectrical coefficient in direction to the applied field $d_{33}$ is $614.6*10^{-12}$ m/V.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for producing a piezoelectric device, the method comprising the steps of:
   producing a stack of ceramic green foil comprising binder and electrode layers formed by stacking and laminating green foils; and
   debindering said stack of ceramic green foils in an atmosphere comprising an inert gas and oxygen,
   wherein the oxygen content of said atmosphere is reduced by adding an apt amount of hydrogen such that said electrode layers are not damaged.

2. The method according to claim 1, wherein said step of debindering is carried out at a temperature in a range between and including 150° C. and 600° C.

3. The method according to claim 1, wherein said atmosphere includes steam with a partial pressure of above 200 mbar.

4. The method according to claim 2, wherein said atmosphere includes steam with a partial pressure of above 200 mbar.

5. The method according to claim 1 further comprising the step of sintering said stack at a temperature below melting point of copper, wherein said sintering occurs in an atmosphere comprising nitrogen, hydrogen and steam, and wherein oxygen partial pressure is set by an apt hydrogen concentration such that equilibrate partial pressure of equilibrium $Cu/Cu_2O$ is not exceeded.

6. The method according to claim 2 further comprising the step of sintering said stack at a temperature below melting point of copper, wherein said sintering occurs in an atmosphere comprising nitrogen, hydrogen and steam, and wherein oxygen partial pressure is set by an apt hydrogen concentration such that equilibrate partial pressure of equilibrium $Cu/Cu_2O$ is not exceeded.

7. The method according to claim 3 further comprising the step of sintering said stack at a temperature below melting point of copper, wherein said sintering occurs in an atmosphere comprising nitrogen, hydrogen and steam, and wherein oxygen partial pressure is set by an apt hydrogen concentration such that equilibrate partial pressure of equilibrium $Cu/Cu_2O$ is not exceeded.

8. The method according to claim 2, wherein said temperature is maintained for a duration of 2 to 12 hours.

9. The method according to claim 6, wherein said temperature is maintained for a duration of 2 to 12 hours.

10. A method for producing a piezoelectric device, the method comprising the steps of:
    first producing a stack of a ceramic green foil comprising binder and electrode layers by stacking and laminating green foils;
    second debindering said stack in an atmosphere comprising an inert gas and oxygen, wherein oxygen content is reduced by adding an apt amount of hydrogen such that said electrode layers are not damaged; and
    sintering said stack at a temperature below melting point of copper, said sintering occurring in an atmosphere comprising nitrogen, hydrogen and steam,
    wherein oxygen partial pressure is set by an apt hydrogen concentration such that equilibrate partial pressure of equilibrium $Cu/Cu_2O$ is not exceeded.

* * * * *